United States Patent
Hsieh et al.

(10) Patent No.: US 6,565,670 B2
(45) Date of Patent: May 20, 2003

(54) METHOD OF REMOVING INK FROM A SEMICONDUCTOR WAFER

(75) Inventors: Hsiu-Chu Hsieh, Ping-Tung Hsien (TW); Jason Horng, Hsin-Chu (TW); Jason Hsia, Hsin Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/683,471

(22) Filed: Jan. 3, 2002

(65) Prior Publication Data

US 2002/0050282 A1 May 2, 2002

Related U.S. Application Data

(62) Division of application No. 09/562,851, filed on May 1, 2000.

(51) Int. Cl.$^7$ .................................................. B08B 3/08
(52) U.S. Cl. ............................ 134/26; 134/33; 134/38; 134/902
(58) Field of Search ............................ 134/26, 33, 38, 134/902

(56) References Cited

U.S. PATENT DOCUMENTS

| | | | | |
|---|---|---|---|---|
| 4,557,785 A | * | 12/1985 | Ohkuma | 134/198 |
| 5,334,331 A | * | 8/1994 | Fusiak | 134/38 |
| 6,015,467 A | * | 1/2000 | Nagasawa et al. | 134/1 |
| 6,240,933 B1 | * | 6/2001 | Bergman | 134/1.3 |

FOREIGN PATENT DOCUMENTS

JP    05090239 A    *   4/1993

\* cited by examiner

*Primary Examiner*—Randy Gulakowski
*Assistant Examiner*—Joseph Perrin
(74) *Attorney, Agent, or Firm*—Winston Hsu

(57) ABSTRACT

A cleaning method to remove ink from the surface of a semiconductor wafer includes securing the wafer to a spin chuck, submerging the spinning wafer into an N-Methyl-Pyrolidone (NMP) solution to dissolve the ink on the surface of the semiconductor wafer, spraying a cleaning solution onto the surface of the spinning wafer to clean the ink off the surface of the wafer, and blowing gas onto the surface of the spinning wafer so as to remove residue from the surface of the wafer.

11 Claims, 3 Drawing Sheets

METHOD OF REMOVING INK FROM A SEMICONDUCTOR WAFER

CROSS REFERENCE TO RELATED APPLICATIONS

This application is a divisional of U.S. patent application Ser. No. 09/562,851 filed May 1, 2000 now allowed.

BACKGROUND OF INVENTION

1. Field of the Invention

The present invention relates to a method of cleaning a semiconductor wafer, and more particularly, to a method for removing ink from the surface of a semiconductor wafer.

2. Description of the Prior Art

In integrated circuit industry, in order to make active devices on a semiconductor die function properly, ceramic or plastic packaging material is typically used to wrap and protect the semiconductor die. Before a wafer is sent for package, certain electrical property tests are performed first by a wafer manufacturer in order to ensure the quality of the wafer. But since the wafer manufacturer and the wafer packaging company are usually not located at the same factory, the wafer manufacturer usually uses ink to mark each defective die of a wafer so as to distinguish good dies from bad dies of each wafer, and the wafer packaging companies will only package good dies when they receive such inked wafers.

The inking process is usually performed in an automatic testing procedure in the present semiconductor industry. The automatic testing procedure uses a testing program installed in a control unit to decide which die fails the electrical test and then uses ink to mark it. However, the testing machine used in such automatic testing procedure may sometimes become inaccurate or the testing program may use wrong testing parameters so that the marks inked by the testing machine are totally wrong. For example, the ink head may deviate from its normal position and marks on wrong dies.

When such problems occur, the ink on the surface of the wafer has to be removed. Presently the ink on such a wafer is manually washed off using sponge and acetone. The acetone is used as a cleaning solution to dissolve the ink on the surface of a wafer and the sponge is used to manually scrub off the dissolved ink from the surface of the wafer. A lot of cleaning solution is wasted in such process because the operator has to use the solution to flush the surface of the wafer continually. Besides, such process is very time-consuming and unpleasant to the operator because of the exposure to the acetone. Its efficiency is very low and the manual force exerted to the surface of the wafer may easily cause serious damage to the wafer.

SUMMARY OF INVENTION

It is therefore a primary objective of the claimed invention to provide a cleaning method to remove ink from the surface of a semiconductor wafer so as to solve the above-mentioned problems.

According to the claimed invention, the cleaning method includes securing the wafer to a spin chuck, using a first cleaning station to submerge the spinning wafer into an N-Methyl-Pyrolidone (NMP) solution, using a second cleaning station to spray a cleaning solution onto the surface of the spinning wafer, and using a drying station to blowing gas onto the surface of the spinning wafer to remove residue from the surface of the wafer.

It is an advantage of the present invention that the present invention provides an automatic cleaning procedure to perform the ink cleaning process. The manpower can be saved and wastes of cleaning solutions can also be reduced. Furthermore, the surface of each wafer can be cleaned in a much safer manner.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
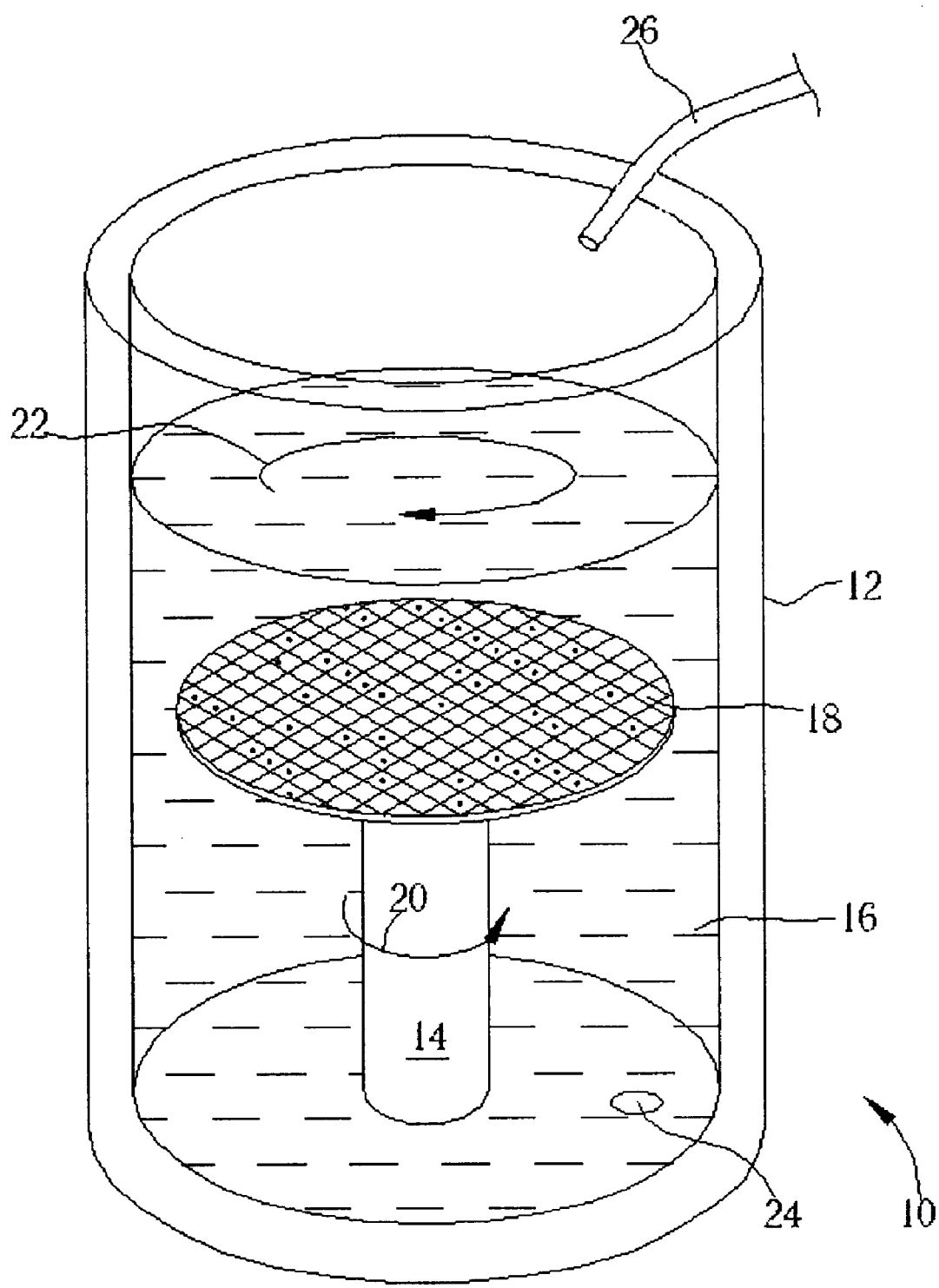
FIG. 1 is a schematic diagram showing a wafer submerged and spun in an NMP solution to dissolve the ink on its surface according to the present invention.

Please refer to FIG. 1. FIG. 1 is a schematic diagram showing that a wafer is submerged and spun to dissolve the ink on its surface according to the present invention. As shown in FIG. 1, the cleaning system 10 comprises a tank 12, a spin chuck 14 positioned inside the tank 12, an outlet 24 positioned on the bottom of the tank 12, and a supply device 26 used to provide a cleaning solution to clean the wafer 18. According to the present invention, the wafer 18 with ink on its surface is horizontally placed on the chuck 14. A vacuum system is then used to secure the wafer 18 to the chuck 14 when the wafer 18 is spun with the chuck 14. The tank 12 is filled with an N-Methyl-Pyrolidone (NMP) solution 16 and the whole wafer 18 is submerged into the NMP solution 16. The NMP solution is used to dissolve the ink on the surface of the wafer 18. During the cleaning process, the chuck 14 spins along a first spinning direction 20 and the NMP solution 16 spins along a second spinning direction 22 opposite to the first spinning direction 20 in order to increase the dissolving speed of the ink.

After the wafer 18 is cleaned in the NMP solution 16, the NMP solution 16 is released from the tank 12 via the outlet 24. The chuck 14 can be designed to lift up the wafer 18 above the surface of the NMP solution 16 in order to perform the next cleaning process.

Figure 2:
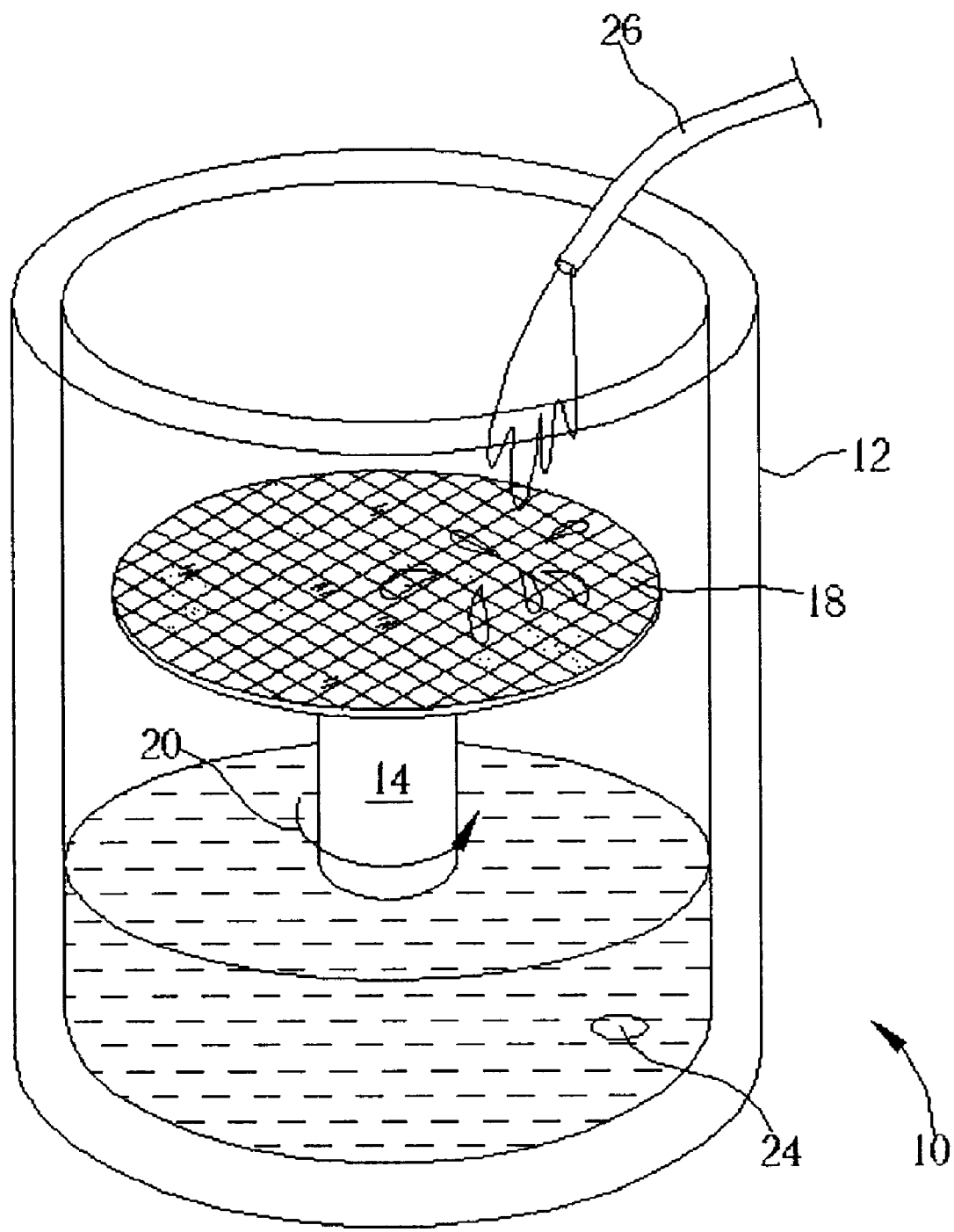
FIG. 2 is a schematic diagram showing a wafer spun and sprayed with a cleaning solution according to the present invention.

Please refer to FIG. 2. FIG. 2 is a schematic diagram showing that the wafer 18 is spun and a cleaning solution is sprayed onto its surface according to the present invention. The wafer 18 is still spun in the spinning direction 20 by the chuck 14, and a cleaning solution is sprayed from the supply device 26 onto the surface of the wafer 18. The cleaning solution can be the NMP solution, or an acetone solution. And then de-ionized (DI) water is sprayed from the supply device 26 onto the surface of the wafer 18 to remove residues or inks on the surface of the wafer 18.

Figure 3:
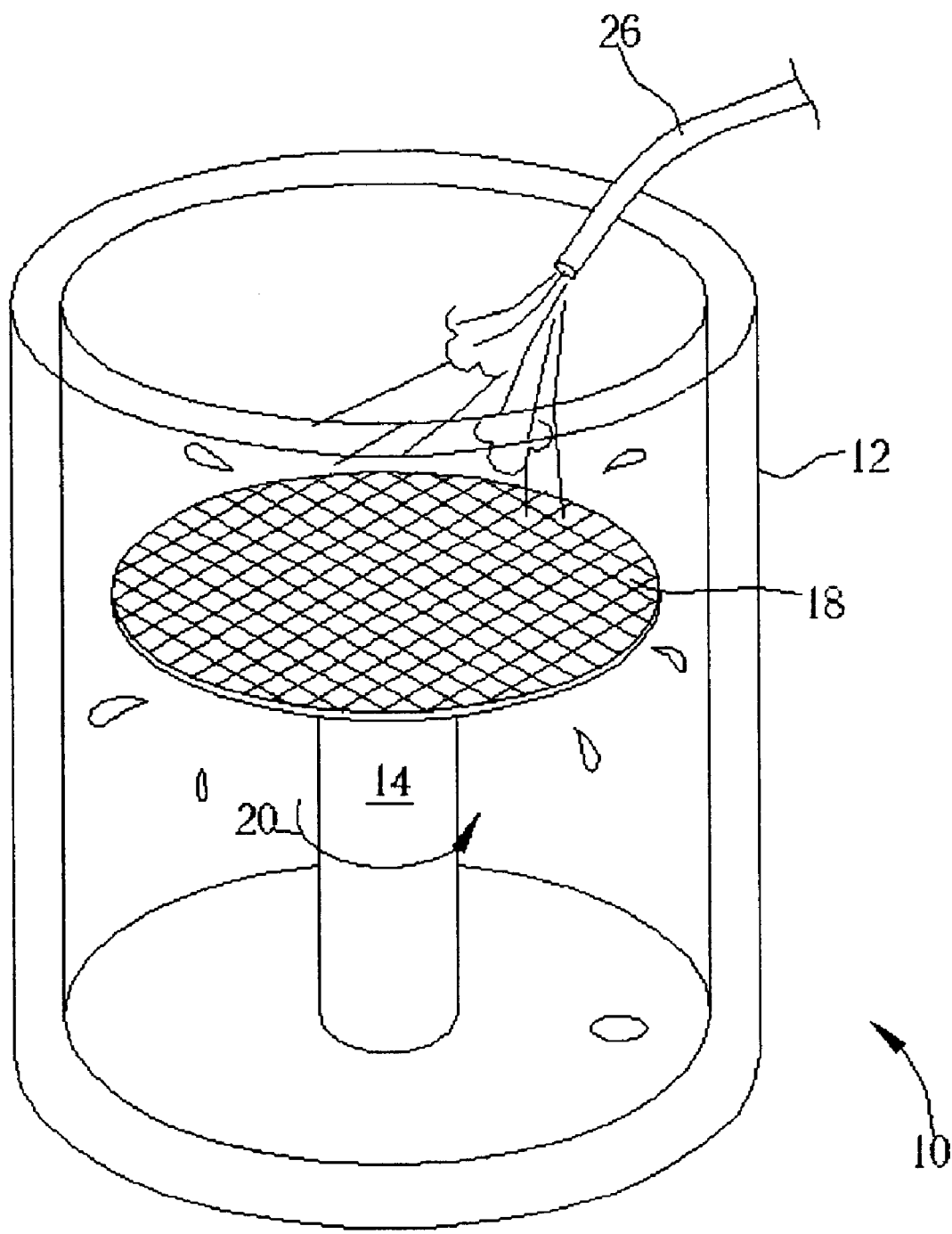
FIG. 3 is a schematic diagram showing a wafer spun and blown with a gas according to the present invention.

Please refer to FIG. 3. FIG. 3 is a schematic diagram showing that a wafer is spun and a gas is blown over its surface according to the present invention. The wafer 18 is spun in the spinning direction 20 by the chuck 14, and dry air or nitrogen is blown from the supply device 26 over the surface of the wafer 18 to remove residual cleaning solution or DI water.

The preferred embodiment of the present invention shown above performs all the cleaning steps in one tank 12. However, it can also be designed to use three cleaning stations to perform the above mentioned cleaning steps. For example, the first cleaning station only uses the NMP solution to dissolve the ink on the surface of the semiconductor wafer. The second cleaning station uses another cleaning solution to clean the wafer after the wafer finishes the first cleaning process. The drying station is used to remove residue from the surface of the wafer after the wafer finishes the second cleaning process.

The cleaning system according to the present invention provides automatic cleaning procedures to remove ink on the surface of a wafer. Compared with the prior art manual method, its efficiency is much better and will seldom cause physical damage to the surface of each wafer. The cleaning solution used in the cleaning system of the present invention can easily be recycled or used to clean more wafers. In addition, since the hand-washing procedure is totally eliminated, stronger cleaning solutions such as the NMP solution can be used in the present invention to remove the ink on the surface of the wafer. It is impossible to use the NMP solution in the prior art method because it is very harmful to human body or human hand.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method to remove ink from the surface of a semiconductor wafer, the method comprising:

securing the wafer to a spin chuck installed in a tank;

pouring an N-Methyl-Pyrolidone (NMP) solution into the tank to totally submerge the spinning wafer into the NMP solution;

draining the NMP solution from an outlet of the tank;

spraying a cleaning solution onto the surface of the spinning wafer; and drying the spinning wafer by blowing gas onto the surface of the spinning wafer to remove residue from the surface of the wafer.

2. The method of claim 1 wherein the NMP solution spins in a direction that is opposite to the spinning of the chuck so as to increase the reactivity between the ink on the wafer and the NMP solution.

3. The method of claim 1 further comprises delivering an NMP solution, acetone, or de-ionized (DI) water, and the gas by at least a supply device to the surface of the spinning wafer so as to remove residual ink from the wafer.

4. The method of claim 1 wherein a vacuum system is used to secure the wafer to the spin chuck.

5. The method of claim 1 wherein the gas is dry air, or nitrogen.

6. The method of claim 1 wherein the outlet permits a flow of solution, the cleaning solution, DI water or NMP solution thus the solution can easily be recycled or used to clean more wafers.

7. A method to remove ink from the surface of a semiconductor wafer, the method comprising:

securing the wafer to a spin chuck installed in a tank;

pouring a first N-Methyl-Pyrolidone (NMP) solution into the tank to totally submerge the spinning wafer into the first NMP solution, wherein the first NMP solution spins in a direction that is opposite to the spinning of the chuck so as to increase the reactivity between the ink on the wafer and the first NMP solution;

draining the first NMP solution from an outlet of the tank;

spraying a second NMP solution onto the surface of the spinning wafer;

spraying de-ionized (DI) water onto the surface of the spinning wafer; and blowing gas onto the surface of the spinning wafer.

8. The method of claim 7 wherein the first NMP solution, the second NMP solution, the DI water, and the gas are delivered by at least a supply device.

9. The method of claim 7 wherein a vacuum system is used to secure the wafer to the spin chuck.

10. The method of claim 7 wherein the gas is dry air, or nitrogen.

11. The method of claim 7 wherein the outlet permits a flow of solution, the cleaning solution, DI water or NMP solution thus the solution can easily be recycled or used to clean more wafers.

* * * * *